US010768219B2

(12) United States Patent
Lenzie et al.

(10) Patent No.: US 10,768,219 B2
(45) Date of Patent: Sep. 8, 2020

(54) METHOD AND APPARATUS FOR FLEXURE TESTING OF ELECTRONIC COMPONENTS

(71) Applicant: Dish Network L.L.C., Englewood, CO (US)

(72) Inventors: Kirk Lenzie, Englewood, CO (US); Jamie Metzger, Englewood, CO (US); Kenneth Jones, Englewood, CO (US); Matthew Bailey, Englewood, CO (US)

(73) Assignee: DISH Network L.L.C., Englewood, CO (US)

( * ) Notice: Subject to any disclaimer, the term of this patent is extended or adjusted under 35 U.S.C. 154(b) by 146 days.

(21) Appl. No.: 16/013,575

(22) Filed: Jun. 20, 2018

(65) Prior Publication Data
US 2019/0391200 A1 Dec. 26, 2019

(51) Int. Cl.
G01R 31/28 (2006.01)
H05K 1/02 (2006.01)
H05K 1/18 (2006.01)

(52) U.S. Cl.
CPC ..... *G01R 31/2808* (2013.01); *G01R 31/2817* (2013.01); *H05K 1/0268* (2013.01);
(Continued)

(58) Field of Classification Search
CPC ............ G01R 1/07378; G01R 31/2889; G01R 1/07342; G01R 1/0466; G01R 31/2891;
(Continued)

(56) References Cited

U.S. PATENT DOCUMENTS 4,427,250 A * 1/1984 Hines ................. G01R 1/07307
439/296
5,424,634 A 6/1995 Goldfarb et al.
(Continued)

FOREIGN PATENT DOCUMENTS

EP 0 997 740 A1 5/2000
FR 2 899 969 A1 10/2007
(Continued)

OTHER PUBLICATIONS

Lau et al., "Experimental Testing and Computational Stress Analysis of Printed Circuit Board for the Failure Prediction of Passive Components under the Depaneling Load Condition," *55th Electronic Components and Technology Conference*, Lake Buena Vista, Florida, USA, May 31-Jun. 3, 2005, pp. 1783-1791.
Intel Corporation, "Intel Strain Measurement Methodology for Circuit Board Assembly—Board Flexure Initiative (BFI)," Intel Manufacturing Enabling Guide, Mar. 2016, 59 pages.

*Primary Examiner* — Vinh P Nguyen
(74) *Attorney, Agent, or Firm* — Seed Intellectual Property Law Group LLP

(57) ABSTRACT

Disclosed herein is a method and apparatus for testing the response of electrical circuits to being flexed. Support members, preferably at least two, are positioned to receive the electrical circuits to be tested. The support members are spaced apart from each other to permit the electrical circuit to be flexed between the two support members. A plunger, having an arcuate front face is positioned between the support members. The plunger is depressed, flexing the electrical circuit a selected amount. After the circuit has been flexed a selected amount, the circuit is tested to determine whether or not it is fully operational after being flexed.

17 Claims, 8 Drawing Sheets

(52) U.S. Cl.
CPC ..... *H05K 1/189* (2013.01); *H05K 2201/1003* (2013.01); *H05K 2201/10015* (2013.01); *H05K 2201/10022* (2013.01); *H05K 2201/10166* (2013.01); *H05K 2201/10522* (2013.01)

(58) Field of Classification Search
CPC .............. G01R 1/0483; G01R 31/2887; G01R 1/0735; G01R 31/2808; G01R 1/07314; G01R 1/07357; G01R 1/073; G01R 1/07307; G01R 31/31905; G01R 1/0408; G01R 1/0416; G01R 31/2818; G01R 31/2851; G01R 31/2863; G01R 1/0491; G01R 31/2801; G01R 31/2865; G01R 1/04; G01R 31/2831; G01R 31/2893; G01R 1/06705; G01R 1/07328; G01R 31/2817; G01R 31/2855; H01L 21/486; H01L 23/49827; H01L 24/10

See application file for complete search history.

(56) References Cited

U.S. PATENT DOCUMENTS

| | | | | |
|---|---|---|---|---|
| 6,259,265 | B1 * | 7/2001 | Han ................... | G01R 1/07314 324/537 |
| 7,598,756 | B2 * | 10/2009 | Inoue ................. | G01R 31/2886 324/754.03 |
| 9,453,875 | B2 * | 9/2016 | Yang .................. | G01R 31/2808 |

FOREIGN PATENT DOCUMENTS

| | | |
|---|---|---|
| JP | 2844803 B2 | 1/1999 |
| JP | 2000-321188 A | 11/2000 |
| JP | 2003-65920 A | 3/2003 |
| JP | 2010-78325 A | 4/2010 |

* cited by examiner

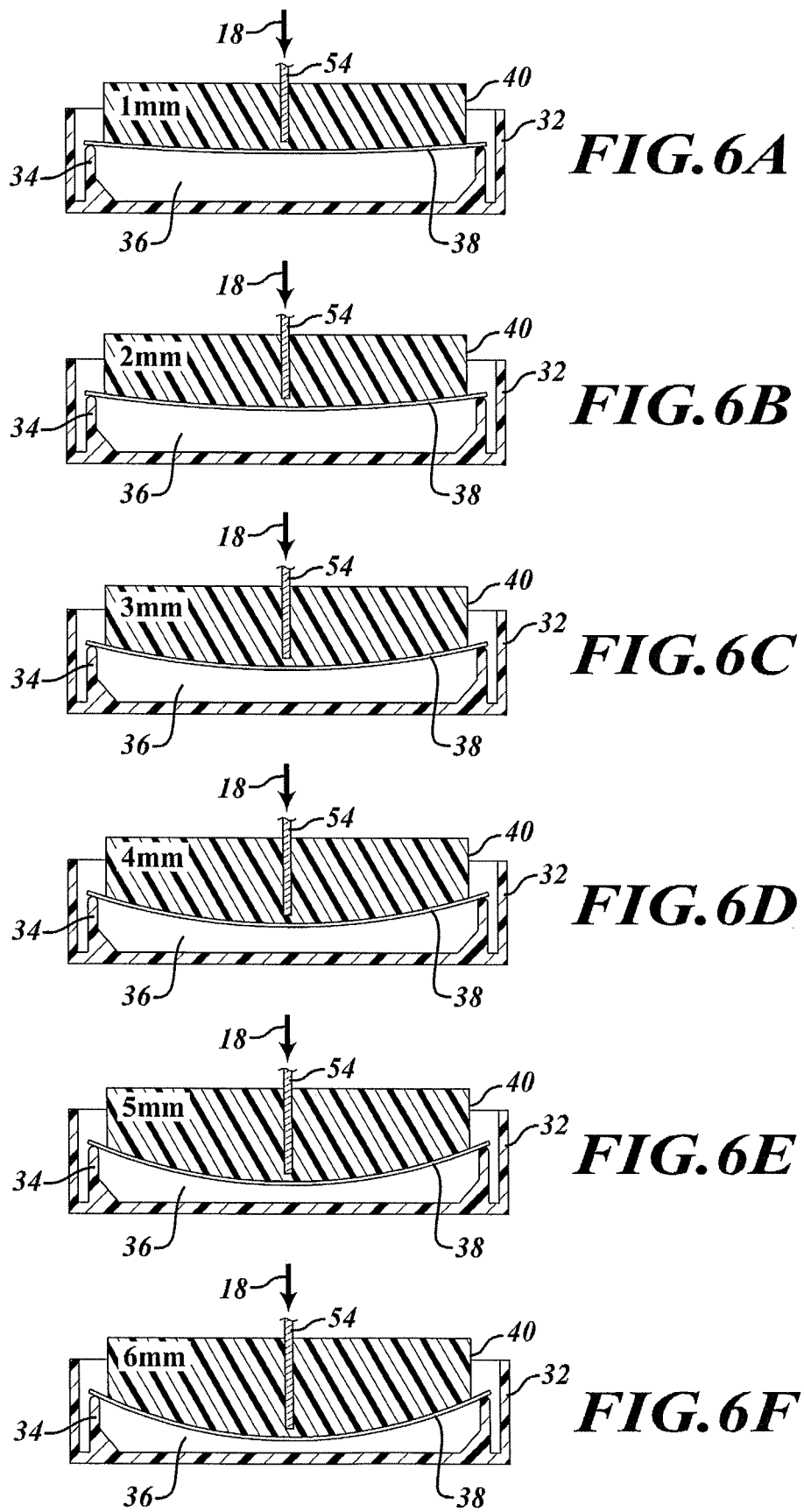

METHOD AND APPARATUS FOR FLEXURE TESTING OF ELECTRONIC COMPONENTS

BACKGROUND

Technical Field

This disclosure is in the field of testing circuit components, and in particular, for testing individual passive and active components as well as a fully assembled printed circuit board.

Description of the Related Art

Resilience from breaking due to minor flexing is an important characteristic for electrical components. Electrical components that must be resilient to flexing include passive components such as resistors, capacitors and inductors. They also include active components such as integrated circuits and individual transistors. In addition, the fully assembled printed circuit board should be resilient when being flexed and constructed in such a way that the circuits mounted thereon do not fail when undergoing minor flexing.

Testing is frequently carried out in order to ensure that a particular electrical circuit, whether passive, active or a fully assembled printed circuit board is sufficiently resilient to flexing that it will not fail. Various industry standards have been established for an electrical circuit to withstand flexing and remain fully operational. According to one standard, the electrical circuit may be subjected to a minor deflection, such as one millimeter, two millimeter, three millimeter, after which a circuit test is carried out to determine whether or not it survived the flexure test.

With the mass production of circuits, individually testing each electrical circuit, whether component or printed circuit board, for resilience to flexing can take significant time.

BRIEF SUMMARY

Disclosed herein is a method and apparatus for testing the response of electrical circuits to being flexed. Support members, preferably at least two, are positioned to receive the electrical circuits to be tested. The support members are spaced apart from each other to permit the electrical circuit to be flexed between the two support members. A plunger, having an arcuate front face is positioned between the support members. The plunger is depressed, flexing the electrical circuit a selected amount. After the circuit has been flexed a selected amount, the circuit is tested to determine whether or not it is fully operational after being flexed.

In one embodiment, the circuit is tested while it is in the flexed position, to determine the electrical characteristics of the circuit while under flex, in another embodiment, the circuit is flexed and then returned to the non-flexed position after which a test is carried out to determine whether or not it is fully operational after the flex and unflex have both taken place.

In one embodiment, a guide member is coupled to the plunger. A housing is provided to receive the circuit to be tested. The guide member rides in a socket mounted on the housing, which channels the guide member along its travel path. This ensures that the plunger accurately travels the same precise path each time to carry out the flex testing.

According to one embodiment, a stop member is positioned on the arcuate plunger and a contact bar is on the housing. When the stop member reaches the contact bar, then further depression of the plunger is prevented, thus ensuring that flexure of the correct amount was precisely carried out. In one embodiment, the socket, as well as the support members are all included within the same housing, the housing having an opening space to receive the plunger as it is depressed therein.

The fixture according to the disclosure described herein can test a variety of electrical circuits. It is capable of testing individual components, which may include passive components of a capacitor, inductor, or resistor. It may also test active components, such as single transistors, diodes, packaged integrated circuits, such as microprocessors, graphics driver chips, display drivers and other circuits mounted on a printed circuit board. In addition, the fixture may test a printed circuit board having all these circuits mounted thereon. Specifically, a fully assembled printed circuit board of the type prepared for placing into a cell phone, computer, large TV display or other consumer electronic product may be tested to simulate the flexing that the circuit may undergo during standard use. The flexure test can thus test whether the printed circuit board, with all the components mounted thereon as would be present in the final product is resilient to flexing, and remains fully operational, even though it may be flexed at selected locations and by different amounts during manufacture, shipping, unpacking, or induced by a customer.

According to one method, the resilience of an electrical circuit to flexure is tested by carrying out a sequence of steps. According to one embodiment, the flexure test is carried out by placing a plurality of electronic components at respective selected locations on a printed circuit board. The printed circuit board is then placed in a flexure test fixture. A plunger is then depressed into the printed circuit board, the plunger contacting the printed circuit board on multiple locations. The plunger is depressed into the printed circuit board to cause the printed circuit board to flex a selected amount, until it reaches a selected bent position. The operational integrity of the electrical components is tested after the plunger has moved the selected distance. In one embodiment, the testing takes place while the circuit board is under flex, to confirm that all the electrical components properly operate while in the flex position. In another embodiment, the testing takes place after the flexing has ended, and the printed circuit board is returned to its natural, unflexed state. Thus, testing can occur at one time, only after both the flexing and unflexing, or twice, once while in the flexed state, and then again after the flex has been removed, so that the full cycle of stress, both from the flex and unflex can be properly tested.

According to one embodiment, the plunger has a surface area that is arcuate and approximately equal to the surface area of the printed circuit board. According to another embodiment, the plunger has two or three different heads which contact the circuit board at different locations in order to apply flex at different locations within the printed circuit board.

BRIEF DESCRIPTION OF THE SEVERAL VIEWS OF THE DRAWINGS

FIG. 6A-6F illustrate different plungers, which depress the printed circuit board different, selected amounts according to this disclosure.

DETAILED DESCRIPTION

Figure 1A:
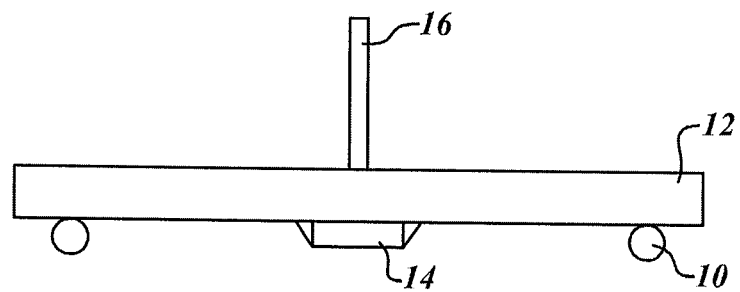
FIGS. 1A and 1B illustrate testing of a passive component according to the standard prior art test.
Figure 1B:
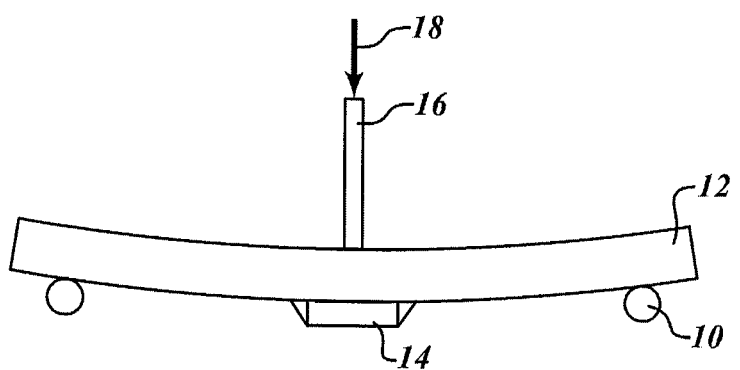

FIGS. 1A and 1B illustrate a flexure test of a type well known and frequently carried out in the prior art. The particular test shown is the standard known as the IEC 60384 standard, though other flexure standards are well known in the art. According to this prior flexure standard, two support members 10 are positioned a fixed distance apart from each other, for example 45 millimeters, 60 millimeters or some other set amount. A printed circuit board (PCB) 12 is placed on the two support members 10. An electrical component to be tested 14 is positioned on the PCB 12. A plunger 16 is placed in contact with the PCB 12 and, as shown in FIG. 1B is depressed a selected amount. The arrow 18 indicates that the plunger 16 has been depressed a selected amount and the PCB 12 is flexed, placing flexure stress on the electrical component 14. The amount of deflection that the electrical component 14 should undergo and still be operational is specified in various test protocols. According to one test protocol, the amount of depression of the plunger 16 is one millimeter. According to other protocols, it can be two or three millimeters. The component 14 is placed exactly opposite the plunger 16 according to the standard, so the component 14 is exactly at the center of the maximum flexure location. This ensures that the component 14 is experiencing an instantaneous arc that is drawn between the two support members 10 as the PCB 12 undergoes deflection between the two support members 10. After the flexure has been carried out as shown in FIG. 1B, the plunger 16 is returned to the state of FIG. 1A so that the PCB 12 is not flexed. After this, the component 14 is electrically tested to determine its electrical integrity. If the component is fully electrically functional, it is determined to have passed the flexure test. The component 14 can thereafter be removed and used in a circuit since it has been shown to be fully operational after flexure. Alternatively, the component 14 can be considered as a sample product that represents all similar products in a lot and other components 14 which are made with an identical characteristic as it can be assumed to have the same characteristics. Thus, the component 14 can be a sample drawn from a lot of identically manufactured components, and all components from that lot can be considered to have passed the flexure test. Therefore, each circuit in the lot can be mounted to a printed circuit board 12 without having to test each individual component 14.

Frequently, there are numerous electrical components 14 to be tested, sometimes several hundred, before they can be placed on a single PCB 12. In addition, there may be numerous lots for each electrical component 14. It is desired to test at least a few components from every lot to ensure that each lot has been properly manufactured to withstand flexure when mounted on a PCB 12. Thus, if one or two samples from each lot are to be tested, the testing can take significant time for each lot and for each design of a PCB 12.

The PCB 12 can be placed in any number of different circuits, including cell phones, TVs, large flat screen displays, notebook computers and the like. Each of these end consumer electronics frequently undergo flexure when being packed, unpacked, mounted, used or manufactured. Accordingly, it is beneficial to test each electrical component as well as the fully assembled printed circuit board itself to ensure that it remains fully functional despite flexure.

Figure 2:
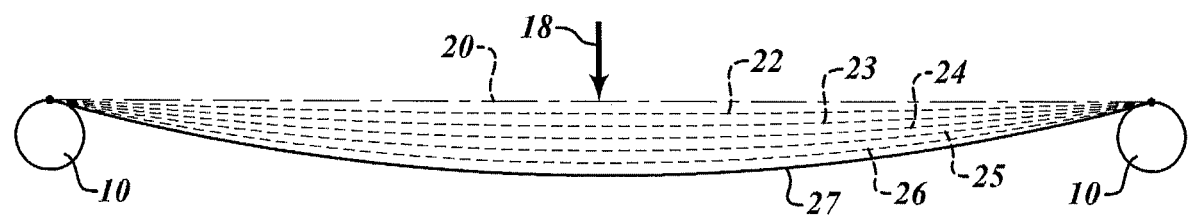
FIG. 2 illustrates different deviations from horizontal, according to different amounts of flexure according to this disclosure.

According to principles of the disclosures described herein, an electrical circuit undergoes a flexure test having a selected amount of deflection as shown in FIG. 2. FIG. 2 illustrates the different amount of flexure that a circuit may undergo and the arc of the flexure for different amounts of deflection. The PCB and electrical circuit will start at a relatively flat position, line 20, and, after being subjected to a force 18 be slightly deflected to a first bent position 22. Similarly, additional force may be applied to place the PCB in each of the bent positions 23, 24, 25, 26 and 27. Each of the flexure positions 22-27 can be a simulation position for a particular flex test. Force 18 is applied until the electrical circuit reaches the flexure position under test, such as one of the positions 22-27, after which the force is removed and the electrical circuit returns to the unflexed state 20 as shown in FIG. 2.

According to the disclosure as provided herein, a fixture 30 for carrying out the flexure shown in FIG. 2, as well as the method of flexure can be carried out on a wide variety of different circuits, which provides substantial benefits which have not been available previously in the art. In its simplest form, the flexure test can be for individual passive components, such as capacitors, resistors or inductors. In other embodiments, the flexure test can be carried out on chips, integrated circuits and other components after they have been mounted to a printed circuit board to test the integrity of the electrical connection, the solder of the chip to the board, the various electrical contacts between the integrated circuit and the circuit board as well as the electrical circuits inside the integrated circuit itself. In addition, the electrical circuit can be the final printed circuit board itself, having numerous components mounted thereon. For example, a sample printed circuit board of the type that will be used in a cell phone, notebook computer or other consumer product can be subjected to the flexure test. This will test the integrity of the fully completed printed circuit board, having all the electrical components thereon, both active and passive, as well as many integrated circuits to ensure it will continue to work when in the final product. This will also ensure that for each electrical component, whether active or passive on the printed circuit board 12 will still operate when subject to flexure.

It is recognized by the inventors that the location of the electrical components on the PCB will greatly affect the amount of stress that that particular component sees under flexing of the PCB. A component mounted at the center may undergo a different stress than a component mounted to one side or halfway between the maximum flexure point and a fixed pivot. Thus, the testing of completed circuit boards is also provided according to the principles as taught herein. In addition, during the manufacture of printed circuit boards, they may undergo a certain flexure at different times in the manufacturing process.

Figure 3:
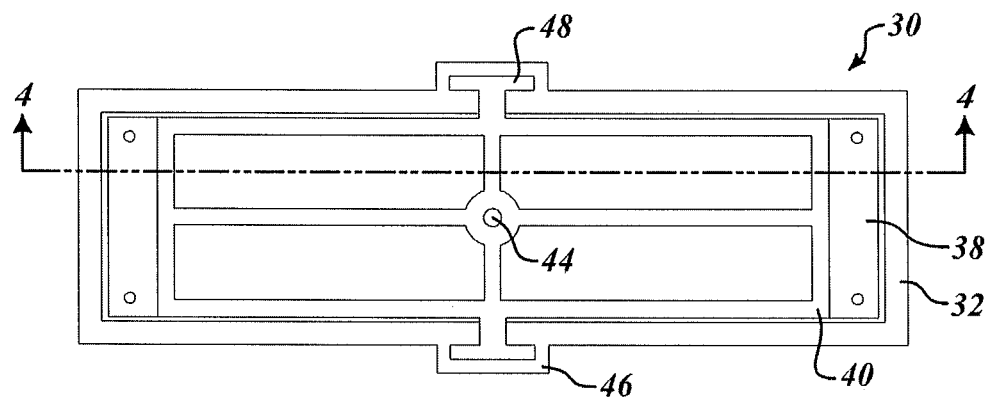
FIG. 3 is a top side view of a fixture having a plunger therein for carrying out the flexure operation according to this disclosure.
Figure 4:
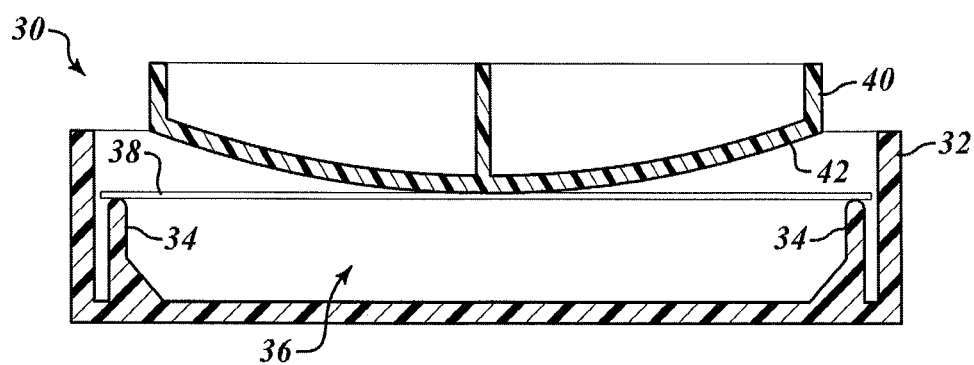
FIG. 4 is a cross-sectional view taken along the lines 4-4 of FIG. 3.

FIGS. 3 and 4 illustrate a fixture 30 for carrying out the flexure to a selected bent position, as illustrated in FIG. 2. Examining FIGS. 3 and 4 together, housing 32 has two support posts 34. Underneath the support post 34 is an open chamber 36. A PCB 38 is positioned on the two post 34, and suspended between them above the opening 36. The housing 32 may contain one or more sockets 46. These sockets 46 receive guide members 48 that are part of the plunger 40. At the bottom of the socket 46 is a plate 50 which the stop member 52 impacts and to prevent the plunger 40 from being further depressed. A plunger 40 is positioned above the PCB 38. The plunger 40 has an arcuate face 42, which faces and comes in contact with the PCB 38.

The plunger 40 has a central recess 44 that can receive a drive shaft 54 in order to depress the plunger 40 a selected amount (see FIG. 6A).

According to some manufacturing techniques, hundreds of printed circuit boards start as a single large sheet and numerous electrical components are placed thereon by pick and place machines, after which each component is soldered or otherwise attached to the large sheet PCB. The PCB might therefore be flexed significantly during the initial manufacturing process. In addition, since many PCBs, sometimes several hundred, are manufactured starting as a single large sheet and afterwards are cut into individual PCBs, the PCB may undergo significant flexure during the initial manufacturing process, prior to being separated. For example, when a large sheet PCB is being cut into individual component PCBs, it may undergo flexing as it is being separated. It might also be flexed right from being cut from the large sheet. Therefore, it is important to ensure that any flexing that occurs during any stage of the manufacturing process of a final PCB does not cause destruction of the electrical circuits which have been mounted thereon up to that point in the manufacturing process.

Further, after the PCB has been separated into an individual PCB ready for mounting into a consumer electronic product, it may undergo flexing while being mounted into the end consumer electronic product, whether the end product is a notebook computer, a cell phone, an automobile or some other structure. After the printed circuit board has been mounted into the end consumer product, the consumer product is then placed into packaging and shipped for purchase by the end consumer. During the packing and shipping process, the printed circuit board may undergo flexure of various types, particularly if the consumer product is a large screen TV, a notebook computer or other retail product which has a large PCB. The packaging, shipping, and unpackaging process may also cause significant flexure to take place in the printed circuit board after all of the components have been mounted thereon. In addition, once the consumer receives the electronic circuit, the consumer will unpack it and begin to use it which, in some instances, may include mounting the retail product to the wall in the example of a large screen TV. During the mounting process, the retail component may undergo significant flexure, which may cause the printed circuit board and the electrical components thereon to undergo flexure.

The fixture 30 and method as disclosed herein is sufficient to test the full electrical circuit for each of the above circumstances. Namely, it is sufficient to test the individual components which have been mounted on a printed circuit board, a fully completed printed circuit board after all electrical components, both passive and active and integrated circuits have been placed thereon, as well as perform flexure tests that the printed circuit board to simulate it bending is expected to undergo during the manufacturing, shipping, handling, mounting, and consumer use environment. Accordingly, the claims as appended hereto apply to the testing of any electrical circuits, including individual components as well as fully assembled printed circuit boards, and to test for flexure which may occur at any time during the manufacturing process, shipping or end use.

As will be appreciated, the testing is normally carried out on a sample of the printed circuit board and/or components mounted thereon. Once sufficient testing has been carried out on a particular circuit board design and the components thereof, an extrapolation is made that other electrical circuits manufactured with an identical technique and having an identical footprint will also be resilient to flexure of the type which has been carried out in the test.

Figure 5A:
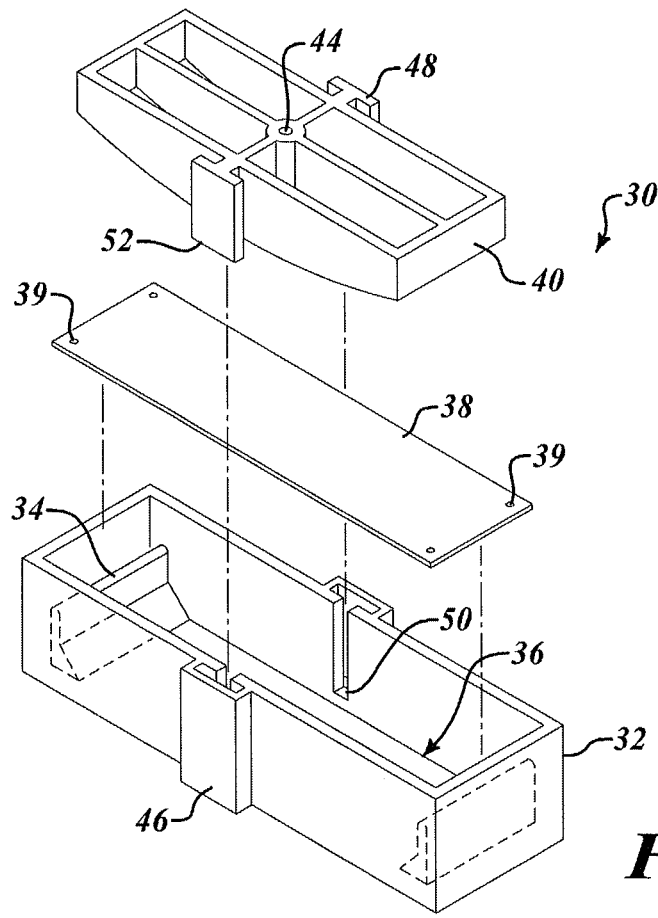
FIG. 5A is an exploded view of a fixture for carrying out the flexure test according to this disclosure.

FIG. 5A shows an exploded view of the fixture 30 as shown in FIGS. 3 and 4. In particular, as can be seen in FIG. 5A, a plunger 40 has one or more guide members 48 that are integrally coupled thereto. The plunger 40 has a central recess 44 to receive a drive shaft 54 to cause it to be pressed down when under force 18 is applied as illustrated in FIG. 2. A printed circuit board 38 is placed under the plunger 40. A housing 32 contains therein one or more support members 34, and below the support member is an open chamber 36 into which the PCB 38 can be deflected. The open chamber 36 can be considered a cavity, recess or other void into which the PCB 38 can enter when it is bent by the plunger 40. At a bottom region of the guide member 48 is a stop member 52. The position, and length of the stop member 52 is selected to cause the plunger 48 to stop movement after depression of a certain amount as described herein.

In one embodiment, the position of the block in member 50 and the length of the stop member 52 is selected to limit the amount of movement downward that a particular plunger 40 can undergo. For plunger 40 which is to undergo only a single millimeter of deflection, the stop member 52 will be extremely long and/or the block member 50 will be positioned high within the socket 46. After the plunger 40 has been depressed one millimeter, the stop member 52 will contact the blocking member 50, and it will not be able to be depressed any further. Thus, even though additional force 18 may be provided, or the drive shaft 54 inside the recess 44 continues to press the circuit board 38 cannot be deflected any more than one millimeter. This ensures that the flexure test that is carried out places the electrical circuits under the exact amount of flexure so it is bent to a selected position regardless of the force being applied at 18 or any other further movement of the drive shaft 54 in the recess 44. This ensures precise flexing, and thus uniform testing of each PCB 38. Thus, the amount of flexure is not dependent upon the drive shaft 54 extending only a selected distance, but rather is set based on a particular plunger 40. If a different amount of deflection is desired, for example, 3 millimeters, then a different plunger 40 is provided. In particular, a completely different physical plunger 40 having a different shape on its face, such as a different arc or different bumps or grooves and a stop member 52 at a different position, usually shorter is positioned in the fixture 30. Because the stop member 52 is shorter for a large flex, the plunger 40 can now be depressed to a greater distance, for example 3 millimeters or 6 millimeters, before it reaches the block member 50 and further depression is halted. As can be seen, the PCB 38 enters the open chamber 36 as it is bent between the support post 34.

Figure 5B:
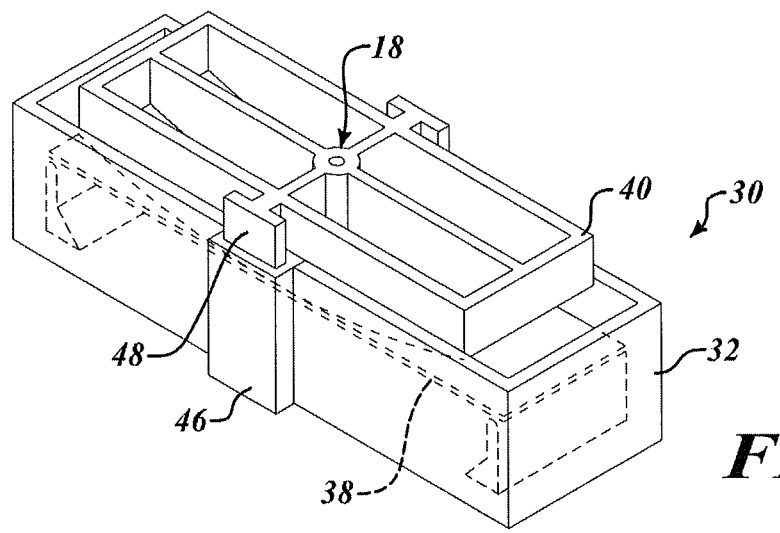
FIGS. 5B-5D illustrate a flexure being carried out as the plunger is depressed into the fixture as shown in FIG. 5A according to this disclosure.
Figure 5C:
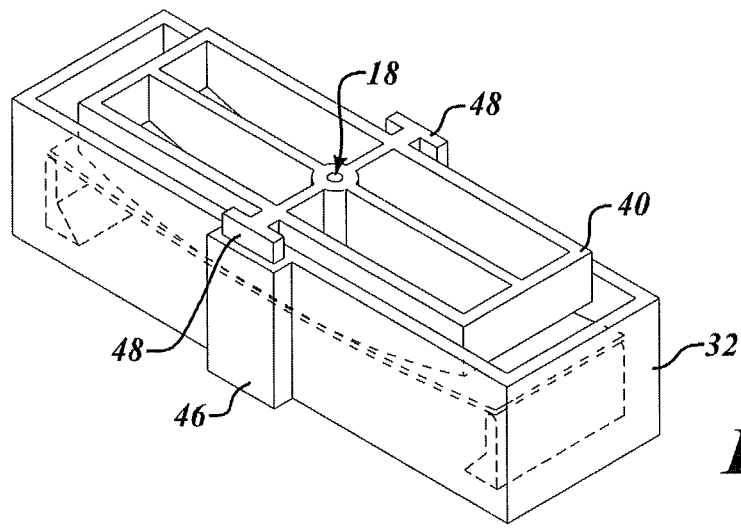
Figure 5D:
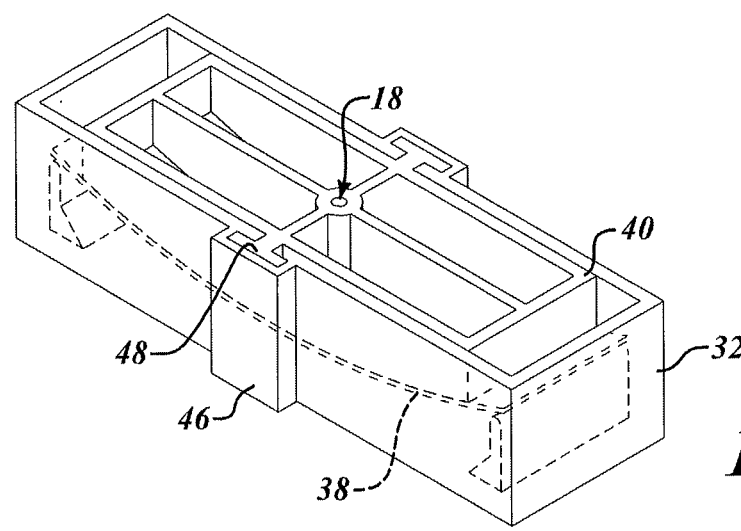

FIGS. 5B-5D illustrate a flexure test being carried out. As shown in FIG. 5B, the plunger 40 has entered into the housing 32, and the guide members 48 are into the sockets 46 as the plunger is depressed. The plunger 40 has contacted the PCB 38 and it is starting to undergo flexure based on the force 18 being provided to the plunger 40. In FIG. 5C, the force 18 continues to be applied to further depress the plunger 40 as the guide members 48 go deeper into the sockets 46. In FIG. 5D, the force 18 has been applied until the plunger 40 has been fully depressed into the housing 32 the amount permitted according to the stop member 52 and the blocking member 50. Because the stop member 52 has reached the blocking member 50, the plunger 40 cannot be depressed any further, and the PCB 38 has been bent the precise, selected amount, according to the shape of the plunger 40 and the relative locations of the stop member 52 and the blocking member 50. At the bottom of the socket 46 is a plate 50 which the stop member 52 impacts and to prevent the plunger 40 from being further depressed.

One embodiment has been described for ensuring that the PCB 38 undergoes a selected amount of deflection, namely the guide members 48 have a stop member 52 at the bottom thereof, which impacts a blocking member 50 inside the housing 32. Other techniques may also be used to ensure that the exact amount of flexure is carried out each time. For example, a stop member may be positioned within the drive shaft assembly 54. Alternatively, a stop member may be positioned at different locations on the plunger 40 to impact a set stop within the housing 32. One of the acceptable techniques to ensure that the plunger 40 has reached the proper deflection is to measure the amount of force 18 applied to the drive shaft 54. As the PCB 38 is deflected, a small amount of force will be applied to the drive shaft 54. A generally constant amount of power will be provided, slightly increasing as the PCB 38 is flexed more and more. At some point, the plunger 40 will be fully depressed with the stop member 52 impacting the blocking member 50. At this moment, the amount of force being applied to the drive shaft 54 will suddenly peak. Namely, as the force 18 continues to try and press the plunger 40 deeper, it will be prevented from doing so and the amount of force applied will rapidly ramp up, indicating that the plunger 40 has reached its maximum depth. Thus, one technique for measuring that the plunger 40 has reached the proper depth, is to place a force meter on the drive shaft 54 and once the force exceeds a threshold amount, then it can be determined that the stop member 52 has hit the blocking member 50 and even as additional force is applied there is no further movement. The amount of force may become quite high and yet there is no movement and, therefore, a rapid increase in the amount of force being applied to the plunger 40 is one good indication of indicating that the maximum deflection has been achieved. Once the threshold force has been reached, then the drive shaft 54 can be retraced and the plunger 40 withdrawn to unflex the board 38. There are, of course, other techniques that can be used in order to ensure that the PCB 38 reaches the selected bent position within the fixture 30. A stop member can be placed at other locations on the fixture or some other stop member can be used as well.

FIG. 6A-6F illustrate different amounts of deflection which the PCB 38 undergoes in a flexure test. A drive shaft 54 has been placed in the recess 44 and a force 18 applied by the drive shaft 54 to drive the plunger 40 downward. The drive shaft 54 has been moved the maximum amount permitted by the shape of the blocking member 50 and stop member 52 (not shown in FIG. 6A). The PCB 38 has therefore reached its maximum deflection that it can reach for a one millimeter flexure test. It entered the internal chamber 36 as it was deflected.

In one embodiment, testing the PCB 38 is carried out while the circuit is under flex as shown in FIG. 6A. In another embodiment, the flexure is removed and the PCB 38 is returned to the non-stress position after which an electrical test is carried out. FIG. 6B illustrates the PCB 38 has been deflected an amount corresponding to 2 millimeters. As previously indicated, the amount of deflection is preset based on the shape of the guide members 48 as they enter the socket 46 within the housing 32. FIGS. 6C-6F illustrate additional deflection of different amounts of the PCB 38, all the way up to testing to simulate a six millimeter flex. As can be appreciated, different amounts of deflection can be obtained, such as 3.5 millimeters, or 7 millimeters or greater if such testing is desired.

In a preferred embodiment, the amount of flexing experienced by the PCB 38 corresponds to the standard, but is not equal to the standard for carrying out a flex test. For example, according to one particular standard, the flexing is to be carried out with two rods 10, exactly 45 millimeters apart from the center of the applied force. The force 18 is applied at a central location to the PCB with the component to be tested, such as the capacitor or other circuit at exactly the center of the board. The amount of flexure that the component experiences under those conditions, namely two posts each 45 millimeters from the center and the force applied exactly at the center with the electronic circuit exactly at the center, can be calculated and simulated but using different actual measurements. For example, the plunger according to the preferred embodiment, might move three or four millimeters to apply the amount of force that is equal to the published standard moving one millimeter. This might occur because the post 34 are a different distance than the standard, such as closer to each other or further from each other than the 45 millimeters from the center as set forth in the standard. In addition, the plunger 40 is not a single point of force but rather is an arcuate shape which contacts the PCB 38 at numerous locations, preferably a continuous contact along its entire path. The embodiments as described herein put the same stress on each electrical component on the entire circuit board, as if that component were at the center of a PCB with the support posts 34 the specified distance apart from each other. Thus, the stress which the PCB 38 and the components thereon undergoes is equal to that of being flexed according to the standard of said amount, such as one millimeter, two millimeter, three millimeters or the like.

According to one embodiment to carry out the standard IEC 60384, in which the PCB is to be supported by two posts 10 that are 45 mm from the center of the board, the plunger has the following shape:

$$r = \sqrt{\frac{(90x^2 - 182250)^2 + 65610000x^2}{32400x^2}}$$

x=Desired component deflection based on IEC standard
r=Radius of curvature of the plunger arc

| x (mm) | r (mm) |
| --- | --- |
| 1 | 1013 |
| 2 | 507.25 |
| 3 | 339 |
| 4 | 255.13 |
| 5 | 205 |
| 6 | 171.75 |

As can be seen by this table and equation, the arc shape of the plunger is selected to carry out the desired deflection. The movement of the plunger will not be 1 mm in distance, rather, the plunger will move into the PCB 38 until all circuits on the board are being flexed by the plunger. When the plunger has been depressed to the stage that all the components on the PCB match the radius of curvature of plunger arc, then they have been flexed an amount that corresponds to the stress they would have received if they have been at the center of the PCB and the only component being tested, as shown in FIGS. 1 and 2. Therefore, the actual movement of plunger and flex may be substantially greater, or less than the stated movement. In most cases, it will be more movement. For example, the plunger might be depressed about 3 to 3.5 mm to complete the flex corresponding to the 1 mm test and may be depressed in the range of 12 mm to complete flex corresponding to the 6 mm test, these numbers being provide as possible examples and the actual numbers may vary depending on the length of each PCB, the circuits thereon and other factors.

Current test structures are currently rated at approximately three millimeters of flex; however, with the principles of the present disclosure as described herein, up to double that amount of flexure can be tested, for example, a flexure that corresponds to six millimeters of movement can be tested, which is an amount of flexure which is not carried out on PCBs according to the published standard, but can be carried out with the fixture 30 of this present disclosure. The PCB 38 may include one or more apertures 39, or other structures which are useful at different stages of the manufacturing process in order to properly secure the PCB 38. The apertures 39 may also be used in the final step of the manufacturing in order to affix the PCB 38 in the consumer electronic, such as a cell phone, laptop computer or other consumer product. While the apertures 39 are shown at the two ends of the PCB 38 as will be appreciated they could be positioned at various locations along the entire length and in the central portion of the PCB 38.

In one embodiment, this testing is useful to carry out the effect of the flexure depending on the location and construction of the apertures 39, since cracking, delamination and other failure may occur at the location of apertures 39. Accordingly, having the apertures 39 positioned at selected locations is also beneficial in carrying out the flexure test.

Figure 7:
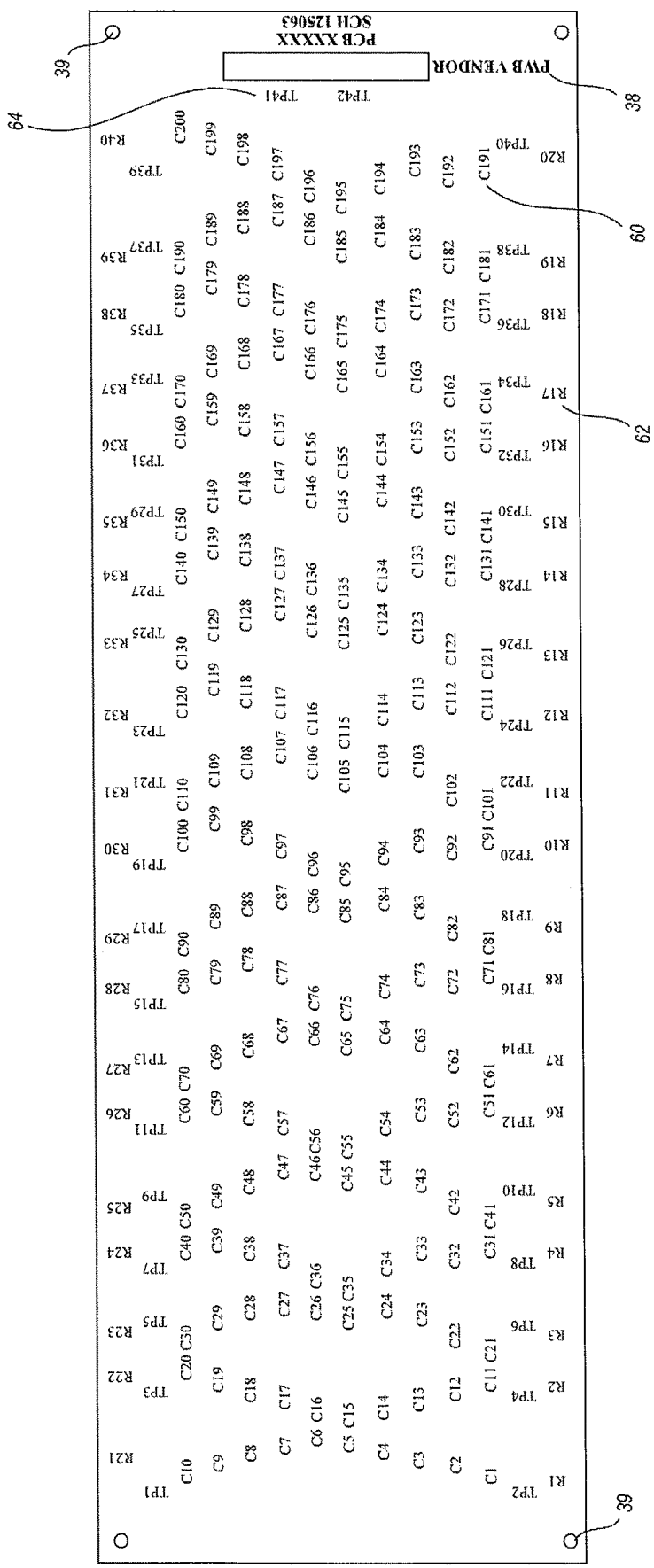
FIG. 7 illustrates one embodiment of a printed circuit board having electrical components thereon to be tested according to this disclosure.

FIG. 7 illustrates one particular embodiment of testing the plurality of electrical circuits.

FIG. 7 illustrates PCB 38 having a plurality of apertures 39, and having a plurality of electrical components mounted thereon. In the embodiment shown in FIG. 7, the electrical components are capacitors 60 and resistors 62. For ease in illustration, each of the components are numbered, the capacitors being numbered C1-C200, and the resistors being numbered R1-R40. In the particular layout shown in FIG. 7, the circuit components to be tested are the capacitor 60 and the resistors R1-R40 are for assistance in carrying out the electrical test. For example, one of the electrical tests that may be carried on the capacitor 60 is to determine the RC time constant of a particular capacitor bank. Alternatively, the circuit test carried out may be to determine the frequency of an RCL tank circuit or the characteristics of an input pulse to an RC circuit. Accordingly, the resistors are not the components being tested, but rather are placed at a location to ensure that they will always be reliable because components being tested are the capacitors C1-C200.

In one embodiment, each of the capacitors C1-C10 are taken from one lot of capacitor production, and another set of capacitors C11-C20 are taken from a second lot of capacitor production. Thus, an entire row of capacitors in this case 10 can be tested from a single lot and 20 lots can be tested at one time, in a single test. The circuit board 38 includes a plurality of contact pads 64, labeled TP1-TP42. These electrical contact pads 64 labeled TP1-TP42 are available for electrical probes to be placed thereon to test the integrity of the capacitors C1-C200. The two probes at the far end TP41 and TP42 permit testing of all capacitors at the same time to determine the combined capacitance of all capacitors on the board. This permits a single test to be carried out to determine if the total capacitance is at the expected value. Another precise test can be carried out, such as determining the frequency of an LC tank circuit, the decay of an RC circuit or, the response to an RCL circuit or any other number of tests to precisely determine the exact capacitance as present on the circuit board 38. In addition, each row of capacitors can be individually tested by applying test probes to the contact pads at each end of each column, for example, applying test probes to TP1 and TP2 can test the column of capacitors C1-C10. Applying test probes to TP3 and TP4 permits testing of the capacitors in column C11-C20, and so on, up until capacitors C199 to C200.

The particular physical location of the capacitors is beneficial according to one embodiment. As can be seen, the capacitors in the first column have an arcuate shape with C1 and C10 being the most to the left hand side, and C5 and C6 being towards the central region. The various columns in the middle have different shapes, somewhat arcuate but also staggered in different ways. The inventors have simulated the amount of stress that each location on the PCB will undergo. As can be appreciated, the stress at a central location, such as where C106 and C116 are located, may be somewhat different from the amount of stress that the capacitor at the location of C108, C178, or C23 undergoes. However, by selected placement of the capacitors, the inventors have determined a pattern which each capacitor undergoes exactly the same flexure and the same stress. Namely, the pattern as illustrated in FIG. 7 ensures that the capacitor which is located at C24 will undergo the very same flexure, bending, and stress as the capacitor located at C98 or capacitor located at C167. The location of each capacitor 60 is selected to simulate the stress that capacitor would undergo if it were at the very center of the PCB 38 and it were the only component on the PCB 38.

The pattern of having the edge capacitors slightly to the outer edges and the central capacitors more to the inner part is a particular placement in order to ensure that each capacitor undergoes the same flexure and the same stress as the plunger 40 is depressed the selected amount. The circuit components to be tested in FIG. 7 are the individual capacitors themselves, not the circuit board as a whole. Accordingly, it is desired that each capacitor undergo the same flexure test. This permits 200 capacitors to be tested simultaneously, something that was not possible in the prior art. In addition, it is desired to ensure the amount of flexure of each capacitor is consistent with the pattern of the capacitor layout also takes into account the change in the stiffness of the PCB 38 based on the capacitors being present. Thus, mounting the different capacitors at different locations will change the stiffness of the PCB 38. The location of each capacitor is selected so that a particular capacitor does not make one area more stiff than the other. Thus, the desire is to avoid the component itself from affecting the testing of it, and from changing the stiffness of the board of the test result. In addition, during the test, the plunger is kept directly on track, to prevent displacement along an extra Y axis. In particular, the guide members 48 are kept consistently within the sockets 46 to ensure that the X and Y axis motion of the PCB 38 is consistent at each test and that the only change made is in the Z axis, namely in the vertical displacement. The width and the length location of the PCB will be identical and there will be no movement either in the width or the length during the carrying out of the test.

The particular arrangement of capacitors 60 on the PCB 38 as shown in FIG. 7 permits a wide variety of testing to be carried out. The circuit can check the parallel impedance by doing a test of an entire row, namely measure the bank of many capacitors. In addition, the test can be carried out to measure the impedance of an entire column. The circuit is initially tested, prior to placing it under stress, then the flexure is carried out, then the PCB 38 is returned to unstressed, and then the test is run again.

Figure 8:
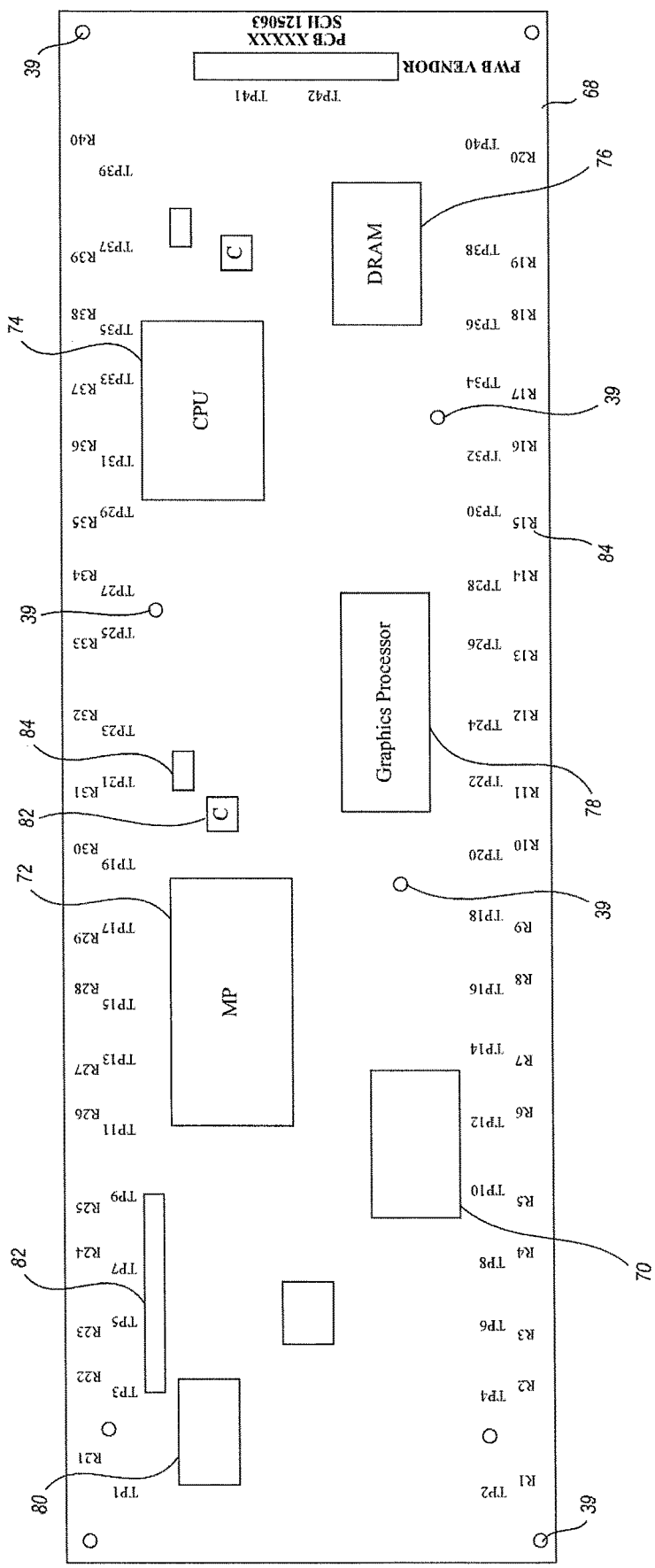
FIG. 8 illustrates another printed circuit board, having electrical components thereon to be tested according to this disclosure.

FIG. 8 illustrates a different PCB 68 which has a plurality of integrated circuits 70 thereon. The integrated circuit 70 may include a microprocessor 72, a CPU 74, one or more memory chips illustrated by DRAM 76, graphics processor 78, and one or more power control chips 80, as well as any other circuits. Thus, the circuit board 68 of this embodiment is a fully functional circuit board containing a combination of capacitors 82, resistors 84, and other passive components which may include inductors, as well as individual transistors and various power drive circuits. The PCB 68 is of a design which is intended to go into a final consumer product. This PCB 68 is manufactured according to known manufacturing techniques. One of the known techniques is to have a very large PCB which may include dozens or even hundreds of identical PCBs 68, all as a single sheet. Each of the electronic circuits 70 is placed on the large PCB by a pick-and-place machine or other technique and then each is soldered in place. After this soldering takes place and the large PCB has been assembled, then a saw, router, or other cutting technique is used to individually cut each PCB 68 from the large printed circuit board which has been made in the manufacturing machine. At this stage, the PCB 68 is in its final condition, ready for insertion into the end consumer electronic product. The PCB 68 may include a number of apertures 39 at different locations throughout the PCB, which may be used to affix it inside the end consumer electronic product or might be used for electrical connections.

At the stage as shown in FIG. 8, it is desired to perform a flexure test on the final PCB 68 to determine whether it will survive an expected amount of bending which may occur at different stages in the process, including a later manufacturing stage when it is inserted into the consumer product by another robot or technician, at a packing stage, and unpacking stage, or while being used by the consumer. Accordingly, the fully assembled PCB 68 is placed in the fixture 30 and the test is carried out as previously explained. One or more taps labeled TP1-TP41 may be connected to numerous of the circuits 70 in order to perform electrical tests before the flexure and after the flexure to determine the structural integrity of any solder bonds, as well as the electrical integrity of any of the circuit components that have been mounted on the circuit board 68.

In one embodiment, as shown the plunger 40 is an arcuate plunger which subjects the PCB 38, 68, or other PCB to a desired amount of deflection according to its shape. In an alternative embodiment, the plunger 40 may have an alternative shape based on a particular PCB 68 to be tested. For example, as can be appreciated, some PCBs will be fixed in the center through apertures 39, as shown in FIG. 8. In such instances, it may be desired to have bumps extending from the plunger 40 at selected locations. For example, a bump may extend out from the plunger at a midpoint between two of the apertures 39 to cause the circuit board 68 to undergo a flex at that selected location of the bump on the plunger. When circuit board is mounted in an end product, it will be rigidly fixed by screws, rivets, plastic tabs, or other fasteners at various apertures 39 and, therefore, will be quite rigid at the location of the aperture 39 and unable to flex at that location. However, flexure may occur in between the apertures 39 which is a localized flexure that may cause more harm than a gradual flexure of the entire board. Accordingly, a plunger 40 having selected bumps, protrusions, or other shapes at selected locations that extend from the face of plunger 40 in order to test the flexure of the circuit between apertures 39 is beneficial in many instances.

In the example shown in FIG. 8, a protrusion may be positioned adjacent to or directly on top of microprocessor 72 in order to determine how the microprocessor 72 will respond to a flex which occurs between two apertures 39. Similarly, a protrusion may be positioned halfway between the CPU and the DRAM, which is approximately the central location between four of the apertures 39 in order to test a defluxion at that localized pointed which may occur at different stages of the manufacture and assembly of the consumer product or the packing, removal, and use of the consumer product. Thus, the current fixture 30 permits localized testing of PCB 68 to simulate potential stresses that may occur at all the different stages of manufacture as well as end use.

Figure 9:
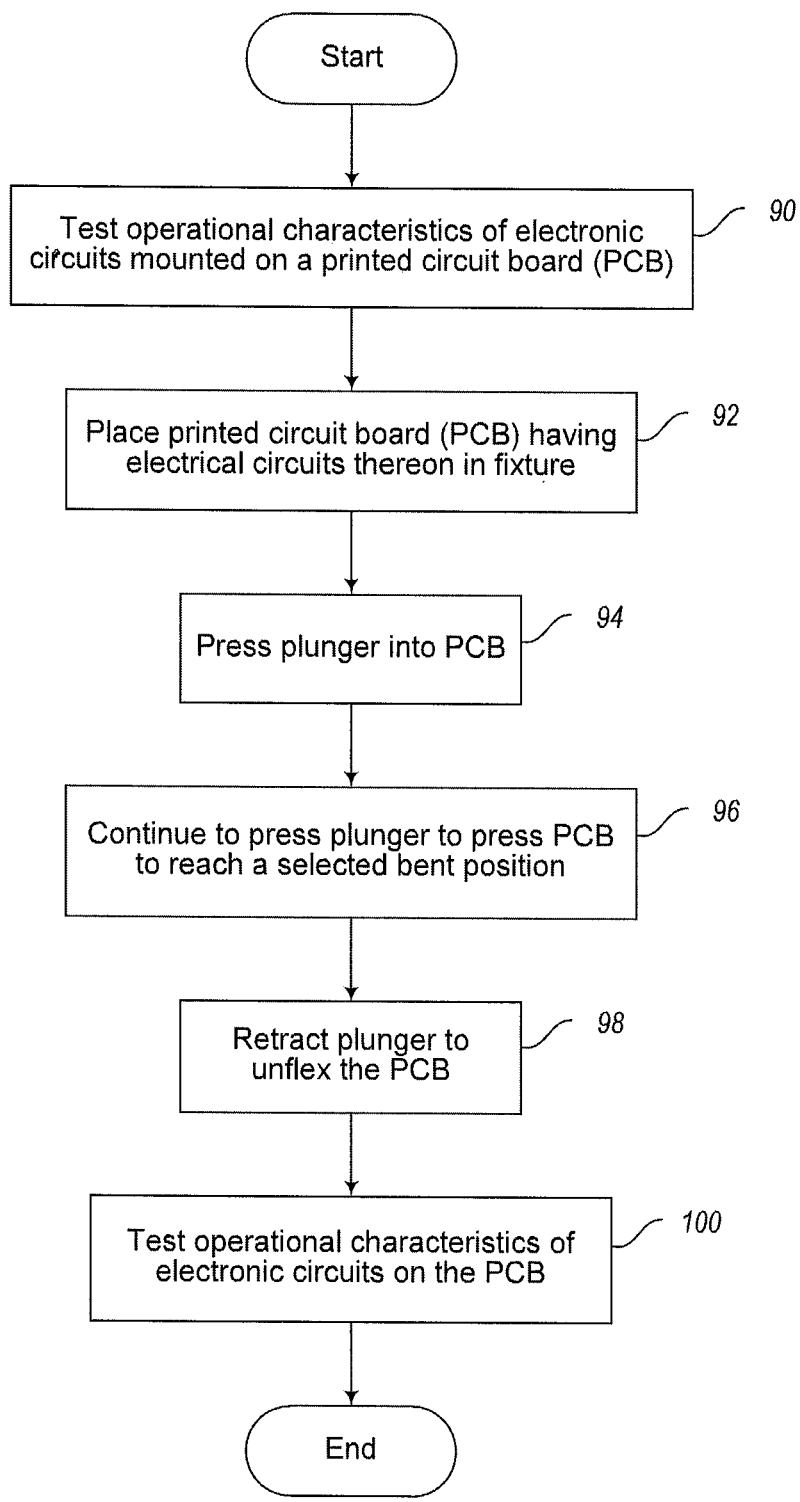
FIG. 9 shows a flow chart of a sequence of steps according to this disclosure for carrying out the flexure test.

FIG. 9 illustrates a method for carrying out the test according to one or more embodiments as described herein. According to one embodiment, the electrical components 70-82 are mounted to the printed circuit board, and a first electrical test is carried out. Each component 70-82 as well as the entire printed circuit board is tested to ensure that the electrical components mounted thereon operate properly step 90. This first test is carried out prior to any flexure to ensure that the initial soldering as well as the circuit arrangement of each of the components on the printed circuit board is proper. After the first electrical test is carried out in step 90, then the printed circuit board is placed in the fixture 30, step 92 and is subjected to flexure, step 94. The pressing continues until a preset amount until the PCB reaches a selected bent position, step 90. In one embodiment, a second electrical test is carried out while the printed circuit board is currently under maximum flexure. This will confirm the operational capability of the electrical components 70-82 as well as the full printed circuit board 38 while under stress during a maximum expected deflection in a bent position. After the printed circuit board 38 has reached the maximum bent position, the flexure is removed, step 98, and the printed circuit board 38 returns to its unstressed state. At this stage, a circuit test is carried out to confirm the electrical and structural integrity of each component on the printed circuit board, as well as the printed circuit board itself in its entirety, step 100. At the time of the final test, two flexures have occurred, a first flexure in which it is deflected out of the resting position, step 96, and a second flexure in which it is returned from the bent position to the unstressed state, step 98.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of operational integrity testing a plurality of electronic components comprising:
placing a plurality of electronic components at respective, selected locations on a printed circuit board, each of the electronic components being spaced from each other;
placing the printed circuit board in a flexure test fixture;
pressing a plunger into the printed circuit board, the plunger having a surface area approximately equal to the surface area of the printed circuit board and contacting the printed circuit board at multiple locations, the plunger further including a single arcuate face surface and a stop member;
continuing to press the plunger into the printed circuit board to cause the printed circuit board to flex until the printed circuit board reaches a selected bent position and the stop member halts further movement of the plunger; and
testing the operational integrity of the electric components after the plunger has moved a selected distance, wherein if the electric components are fully electrically functional after the plunger has moved the selected distance, then the electric components are determined to have passed the test.

2. The method according to claim 1 wherein the step of testing the operational integrity of the electric components occurs while the printed circuit board is in the selected bent position.

3. The method according to claim 2 wherein the step of testing the operational integrity of the electric components occurs after the flexure has been removed from the printed circuit board.

4. The method according to claim 1 further including: retracting the plunger to remove a flexure from the printed circuit board.

5. The method according to claim 1 wherein the plunger has an arcuate face that contacts the printed circuit board.

6. A testing fixture comprising:
a housing;
a plurality of support members positioned within the housing and spaced apart from each other;
a plunger having a single arcuate front face, the plunger being positioned between the support members, the plunger further including a stop member;
a guide member coupled to the plunger; and
a socket coupled to the housing and configured to receive the guide member, wherein the stop member limits movement of the plunger.

7. The fixture according to claim 6 further including:
an open space between the support members and positioned under the plunger configured to receive the plunger.

8. The fixture according to claim 7 further including:
a drive shaft connected to the plunger and configured to drive the plunger into the open space.

9. The fixture according to claim 6 wherein the stop member is positioned on the guide member.

10. The fixture according to claim 9 further including: a blocking member on the housing that contacts the stop member when the plunger is fully depressed to a correct position in the housing.

11. The fixture according to claim 6 further including a printed circuit board positioned within the housing and wherein an electrical circuit to be tested includes a printed circuit board having a plurality of electronic components positioned thereon.

12. The fixture according to claim 11 wherein the electronic components are arranged in horizontal rows.

13. The fixture according to claim 12 further including a plurality of test pads coupled to the printed circuit board, each test pad being coupled to plurality of the electronic components.

14. The fixture according to claim 13 wherein each row of the electronic components has two test pads coupled to that row.

15. The fixture according to claim 11 further wherein the electronic components are arranged in columns, the columns having an accurate shape.

16. The fixture according to claim 6 further including a printed circuit board positioned within the housing and wherein an electrical circuit to be tested includes a passive electrical component mounted on the printed circuit board.

17. The fixture according to claim 6 further including a printed circuit board positioned within the housing and wherein an electrical circuit to be tested includes an integrated circuit having transistors therein, the integrated circuit being mounted to the printed circuit board.

* * * * *